United States Patent
Rhodes et al.

(10) Patent No.: US 9,147,776 B2
(45) Date of Patent: *Sep. 29, 2015

(54) NEGATIVELY CHARGED LAYER TO REDUCE IMAGE MEMORY EFFECT

(71) Applicant: OMNIVISION TECHNOLOGIES, INC., Santa Clara, CA (US)

(72) Inventors: Howard E. Rhodes, Nokomis, FL (US); Dajiang Yang, San Jose, CA (US); Gang Chen, San Jose, CA (US); Duli Mao, Sunnyvale, CA (US); Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/331,646

(22) Filed: Jul. 15, 2014

(65) Prior Publication Data

US 2014/0319639 A1 Oct. 30, 2014

Related U.S. Application Data

(62) Division of application No. 13/660,774, filed on Oct. 25, 2012, now Pat. No. 8,816,462.

(51) Int. Cl.
*H01L 27/146* (2006.01)
*H01L 31/0224* (2006.01)
*H01L 31/103* (2006.01)

(52) U.S. Cl.
CPC ........ *H01L 31/0224* (2013.01); *H01L 27/1462* (2013.01); *H01L 27/14609* (2013.01); *H01L 27/14643* (2013.01); *H01L 31/103* (2013.01)

(58) Field of Classification Search
CPC ..................... H01L 27/14609; H01L 27/1462; H01L 27/14643; H01L 31/0224; H01L 31/103
USPC ................. 257/443, 461, 230, 233, 447, 226; 438/60, 75, 59
See application file for complete search history.

(56) References Cited

U.S. PATENT DOCUMENTS 5,840,624 A  11/1998  Jang et al.
6,083,824 A   7/2000  Tsai et al.

(Continued)

OTHER PUBLICATIONS

Cacciato et al., "Borderless Nitride Requirements for Embedded Non-Volatile Deep Sub-Micron Technologies," Philips Semiconductors, Nijmegen, The Netherlands, IEEE, 2003, pp. 485-488.

(Continued)

*Primary Examiner* — Mohammed Shamsuzzaman
(74) *Attorney, Agent, or Firm* — Blakely Sokoloff Taylor & Zafman LLP

(57) ABSTRACT

An image sensor pixel includes a photodiode region having a first polarity doping type disposed in a semiconductor layer. A pinning surface layer having a second polarity doping type is disposed over the photodiode region in the semiconductor layer. The second polarity is opposite from the first polarity. A first polarity charge layer is disposed proximate to the pinning surface layer over the photodiode region. A contact etch stop layer is disposed over the photodiode region proximate to the first polarity charge layer. The first polarity charge layer is disposed between the pinning surface layer and the contact etch stop layer such that first polarity charge layer cancels out charge having a second polarity that is induced in the contact etch stop layer. A passivation layer is also disposed over the photodiode region between the pinning surface layer and the first polarity charge layer.

7 Claims, 6 Drawing Sheets

(56) References Cited

U.S. PATENT DOCUMENTS

| | | |
|---|---|---|
| 7,256,469 B2 * | 8/2007 | Kanbe .......................... 257/461 |
| 7,354,791 B2 | 4/2008 | Yamada |
| 7,939,860 B2 * | 5/2011 | Takimoto ..................... 257/233 |
| 8,154,097 B2 | 4/2012 | Kim et al. |
| 2005/0280046 A1 * | 12/2005 | Shin ............................. 257/226 |
| 2008/0081393 A1 * | 4/2008 | Park et al. ...................... 438/59 |
| 2009/0317936 A1 * | 12/2009 | Kanbe ............................ 438/75 |
| 2011/0237014 A1 * | 9/2011 | Hiyama et al. ................. 438/60 |
| 2011/0241151 A1 | 10/2011 | Nakatani et al. |
| 2013/0002918 A1 | 1/2013 | Kobayashi et al. |
| 2013/0032921 A1 * | 2/2013 | Tai et al. ....................... 257/447 |
| 2013/0341684 A1 * | 12/2013 | Fukuro et al. ................ 257/230 |
| 2014/0117485 A1 | 5/2014 | Rhodes et al. |
| 2014/0327102 A1 | 11/2014 | Rhodes et al. |

OTHER PUBLICATIONS

Lachenal et al., "Reliability Investigation of NLDEMOS in 0.13μm SOI CMOS Technology," Proc. 25$^{th}$ International Conference on Microelectronics, Belgrade, Serbia and Montenegro, IEEE, May 2006 (4 pages).

Mora et al., "Reliability Issues Related to Fast Charge Loss Mechanism in Embedded Non Volatile Memories," STMicroelectronics, Crolles Cedex, France, IEEE, IIRW Final Report, 2006, pp. 68-72.

Beylier et al., "Refined Electrical Analysis of Two Charge States Transition Characteristic of "Borderless" Silicon Nitride," STMicroelectronics, Crolles, France, Microelectronics Reliability 47, pp. 743-747, available online Mar. 26, 2007.

* cited by examiner

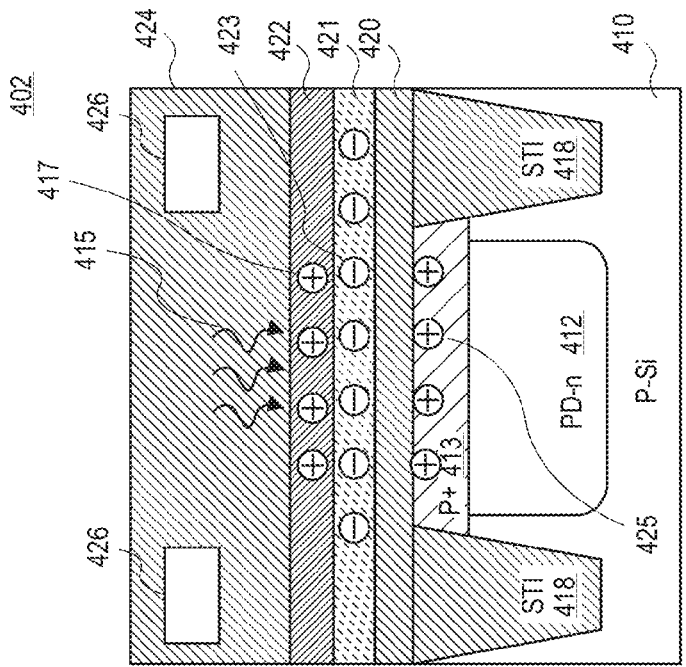
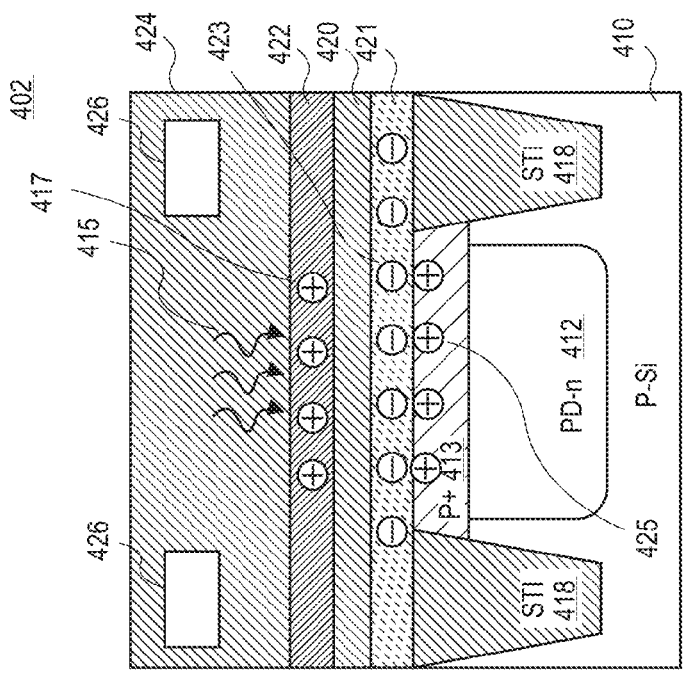

NEGATIVELY CHARGED LAYER TO REDUCE IMAGE MEMORY EFFECT

REFERENCE TO RELATED APPLICATION

The present application is a Divisional of U.S. patent application Ser. No. 13/660,774, filed on Oct. 25, 2012, now pending. U.S. patent application Ser. No. 13/660,774 is hereby incorporated herein by reference.

BACKGROUND INFORMATION

1. Field of the Disclosure

The present invention relates generally to imaging. More specifically, examples of the present invention are related to complementary metal oxide semiconductor based image sensors.

2. Background

The electrical signature of an image with high brightness levels that falls onto a complementary metal oxide semiconductor (CMOS) image sensor may remain embedded in subsequently read out electrical signatures of subsequently acquired images. The electrical signature of a previously sensed image remaining in the image sensor has been called a "ghost artifact" or a "memory effect." This unwanted effect can be exacerbated by repeated exposure of static images, especially high intensity or bright images, to the image sensor. The retention of ghost images represents noise that obscures subsequently acquired images and reduces the signal to noise ratio and may cause blur if there is movement being imaged.

The memory effect problem has been found to be especially present in CMOS image sensors that have been fabricated using advanced fabrication technologies, particularly those employing measures to maximize metal interconnect density. For instance, those fabrication technologies employing so-called "borderless contacts" have been found to be associated with the root cause of this problem.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4A illustrates a cross-section view of one example of an image sensor pixel with a negatively charged layer included in one example of an image sensor that is illuminated with light in accordance with the teachings of the present invention.

FIG. 4B illustrates a cross-section view of another example of an image sensor pixel with a negatively charged layer included in one example of an image sensor that is illuminated with light in accordance with the teachings of the present invention.

Figure 1:
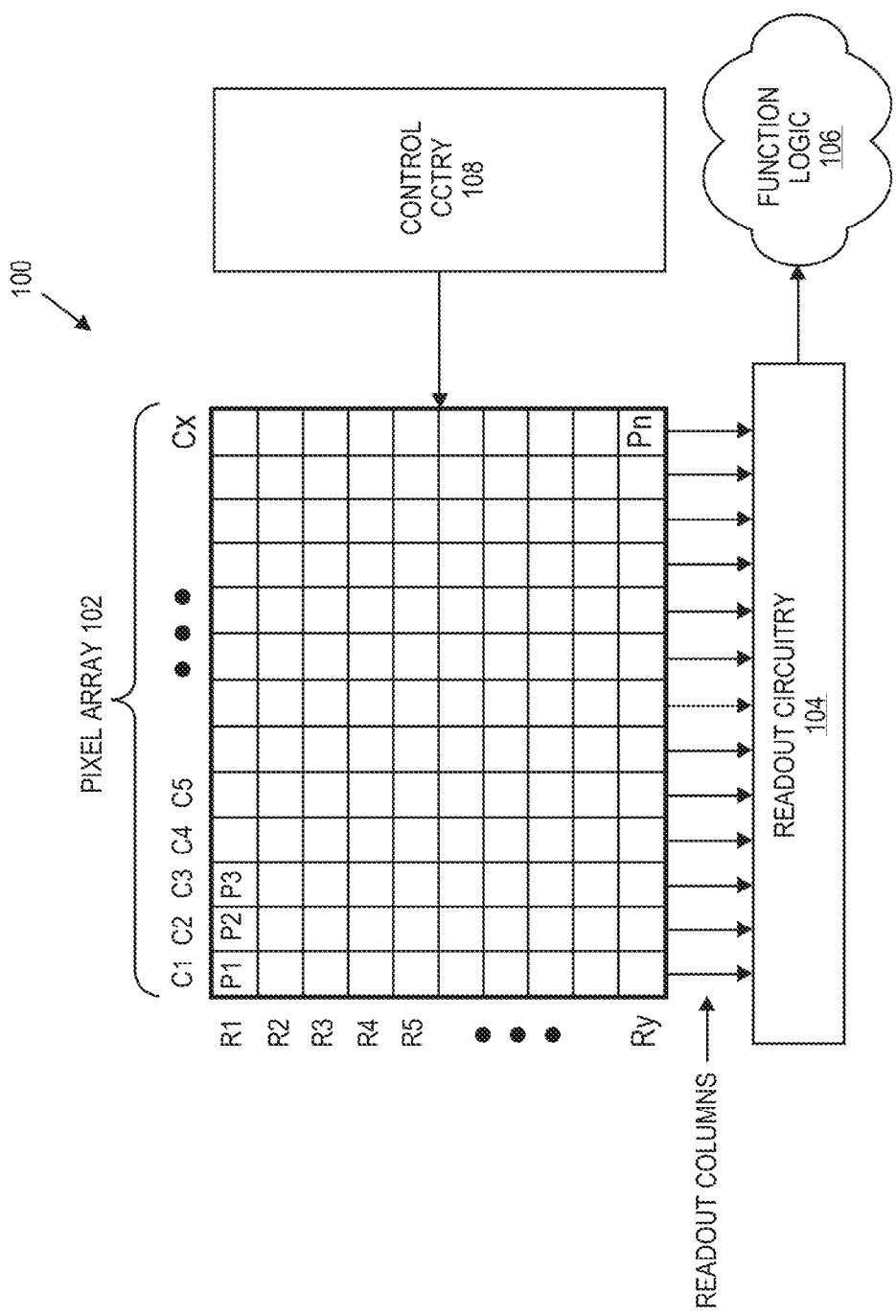
FIG. 1 is a diagram illustrating one example of an imaging system including an example image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present address a contributing factor among the root causes for memory effect in complementary metal oxide semiconductor (CMOS) image sensors and provide solutions to reduce or eliminate memory effect in CMOS image sensors that include contact etch stop layers. Example CMOS image sensors in accordance with the teachings of the present invention include a contact etch stop layer, which makes possible borderless contact elements in CMOS image sensor with reduced or no memory effect. As will be discussed in greater detail below, an additional charged layer is formed between the contact etch stop layer and a pinning layer of the photodiode of the CMOS image sensor in accordance with the teachings of the present invention. For instance, in one example, the negative charges of the added charge layer will mask the unwanted effects of positive charges that are induced in the contact etch stop layer on the underlying photodiode of the image sensor, which reduces ghost artifacts or memory effect in the image sensor in accordance with the teachings of the present invention.

FIG. 1 is a diagram illustrating one example of an imaging system 100 including an example pixel array 102 including an additional charge layer formed proximate to a contact etch stop layer, which masks the unwanted effects of positive charges that are induced in the contact etch stop layer in accordance with the teachings of the present invention. As shown in the depicted example, imaging system 100 includes pixel array 102 coupled to control circuitry 108 and readout circuitry 104, which is coupled to function logic 106.

In one example, pixel array 102 is a two-dimensional (2D) array of imaging sensors or pixels (e.g., pixels P1, P2 . . . , Pn). In one example, each pixel is a CMOS imaging pixel. As illustrated, each pixel is arranged into a row (e.g., rows R1 to Ry) and a column (e.g., column C1 to Cx) to acquire image data of a person, place, object, etc., which can then be used to render an image of the person, place, object, etc.

In one example, after each pixel has acquired its image data or image charge, the image data is read out by readout circuitry 104 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
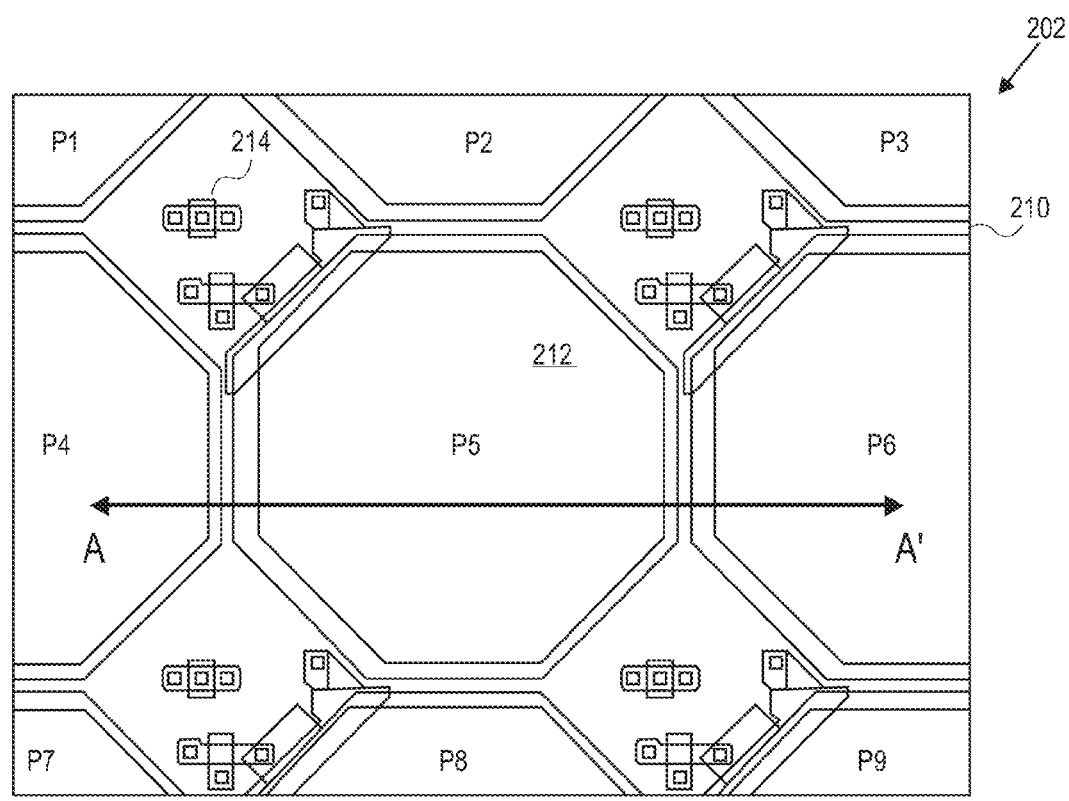
FIG. 2 illustrates a top down view of one example of an example pixel array in accordance with the teachings of the present invention.

FIG. 2 illustrates a top down view of one example of a semiconductor substrate 210 of an example pixel array 202 in accordance with the teachings of the present invention. It is appreciated that in one example, pixel array 202 is an illustration that provides increased detail of example pixel array 102 of FIG. 1. As shown in the example depicted in FIG. 2, pixel array 202 includes semiconductor layer 210 having an array of pixels (e.g., P1, P2, P3, P4, P5, P6, P7, P8, P9, . . . ) arranged therein. As shown in the example, each pixel, such as for example pixel P5 as illustrated in FIG. 2, includes a photodiode 212 as well as associated pixel circuitry 214 coupled to photodiode 212 arranged in pixel array 202 in semiconductor layer 210. In one example, pixel circuitry 214 may include pixel circuit elements such as for example but not limited to a transfer transistor and a floating diffusion. In one example, one or more pixels may also include or share a charge to voltage converting floating diode and an amplifier transistor.

As will be discussed in further detail below, in one example, a charged layer as well as an contact etch stop layer are also formed over pixel array 202. In one example, the charged layer is a negatively charged layer that is formed over the pinning surface layer of the photodiodes of each pixel. The deposition of the contact etch stop layer is a fabrication technique that may be utilized when providing borderless contacts, which may be employed to increase metal interconnect density in pixel array 202. In one example, the negative charges included in the negatively charged layer cancel out the effects of positive charges that may be induced in the contact etch stop layer as a result of strong light illumination, which reduces ghost artifacts or memory effects in pixel array 202 in accordance with the teachings of the present invention.

Figure 3A:
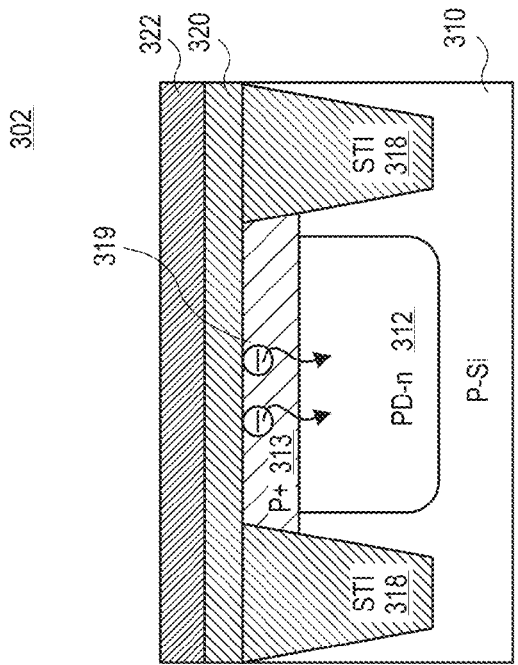
FIG. 3A illustrates a cross-section view of one example of an image sensor pixel disposed in a semiconductor layer without a negatively charged layer that is illuminated with light.

To illustrate, FIG. 3A shows a cross-section view of an example semiconductor layer 310 included in an example pixel array 302 of a CMOS image sensor without a charged layer in accordance with the teachings of the present invention. It is noted that in one example, pixel array 302 corresponds to a cross-section view along line A-A' of pixel array 202 of FIG. 2. As shown in the depicted example, pixel array 302 includes a semiconductor layer 310, which in one example includes P type silicon, with a plurality of photodiode regions 312 arranged therein. In the example, each one of the plurality of photodiode regions 312 is included in a separate pixel of pixel array 302. In one example, each photodiode region 312 includes an N doped region formed in the P type silicon of semiconductor layer 310. As shown in the depicted example, there are shallow trench isolation (STI) 318 regions separating neighboring photodiode regions 312 in the semiconductor layer 310, and therefore define boundaries between the pixels of pixel array 302.

The example illustrated in FIG. 3A also shows that there is a pinning surface layer 313 disposed at the surface of photodiode region 312. In one example, the pinning surface layer 313 includes a P doped pinning region that covers the pixel photosensitive area extending to the STI 318 insulating boundaries and overlaying the N doped photodiode region 312 as shown. FIG. 3A also shows that a passivation layer 320 is deposited over the pinning surface layer 313 of each pixel arranged in semiconductor layer 310 of example pixel array 302 in accordance with the teachings of the present invention. In one example, passivation layer 320 may include insulating material such as for example a silicon oxide based dielectric layer or the like.

The example illustrated in FIG. 3A also illustrates that an contact etch stop layer 322 is deposited over passivation layer 320, which is deposited over the pinning surface layers 313 included in example pixel array 302 as shown in accordance with the teachings of the present invention. In one example, contact etch stop layer 322 is a contact etch stop layer that will be utilized to help provide borderless contacts to be fabricated in pixel array 302. As such, contact etch stop layer 322 will be used to protect underlying structures from damage during a dry etching process that will be used later to form contact openings. Accordingly, contact etch stop layer 322 has a slower etch rate than for example silicon oxide based dielectric layers.

In one example, contact etch stop layer 322 may include a silicon nitride based dielectric including for example, silicon oxynitride, silicon carbide, or the like. In one example, contact etch stop layer 322 may be deposited using a plasma enhanced chemical vapor deposition (PECVD), which employs an electrically driven plasma to breakdown source gases such as Silane ($SiH_4$), ammonia ($NH_4$) and oxygen ($O_2$) to provide sources of silicon, nitrogen and oxygen for the formation of silicon nitride and/or silicon oxynitride of contact etch stop layer 322.

In one example, the resulting contact etch stop layer 322 may therefore be characterized by including significant amounts of mobile charge due to residual hydrogen or poorly formed crystallographic bonding between atoms, such as for example Si—Si bonds or Si—H bonds. In one example, the resulting contact etch stop layer 322 is also characterized by having residual mechanical stress associated with the chosen deposition process parameters or the chosen relative quantities of the reacting gases.

The mobile charges in the PECVD silicon nitride and/or silicon oxynitride of contact etch stop layer 322 can be moved by electrical forces such as electrical fields placed across contact etch stop layer 322, which can cause unwanted effects in nearby semiconductor regions, such as photodiode regions 312 and/or the pixel circuitry included in the pixels of pixel array 302. For example, the source to drain resistance of a transistor included in the pixel circuitry included in the pixels of pixel array 302 may be affected by the mobile charge in the overlying PECVD silicon nitride of contact etch stop layer 322 by altering the depletion characteristics of an underlying lightly doped source or drain region. In addition, it is noted that the interface between the PECVD silicon nitride and/or silicon oxynitride of contact etch stop layer 322 and other films, such as silicon dioxide films, are capable of holding charges typically in broken bonds between various atoms at the interfaces.

Furthermore, it is noted that net positive charges can be induced directly in the PECVD silicon nitride and/or silicon oxynitride of contact etch stop layer 322 by exposure to visible light that may pass through contact etch stop layer 322, especially when photodiode regions 312 of pixel array 302 are illuminated with bright light when imaging. In particular, the energy associated with the phonon modes of the Si—Si and Si—H crystal structures may participate in the optical excitation of the electrical carriers. Consequently, memory effect is caused by the generation of positive charges in, for example, the SiON film of contact etch stop layer 322 that overlies the photodiode region 312 under the strong light illumination.

To illustrate, FIG. 3A shows light 315 illuminating photodiode region 312, which therefore illuminates and passes through contact etch stop layer 322 as shown. This may occur when photodiode region is capturing an image. As a result of this illumination with light 315, positive charge 317 is induced in contact etch stop layer 322, which induces electrons 319 at the surface of the photodiode region 312 as shown.

Figure 3B:
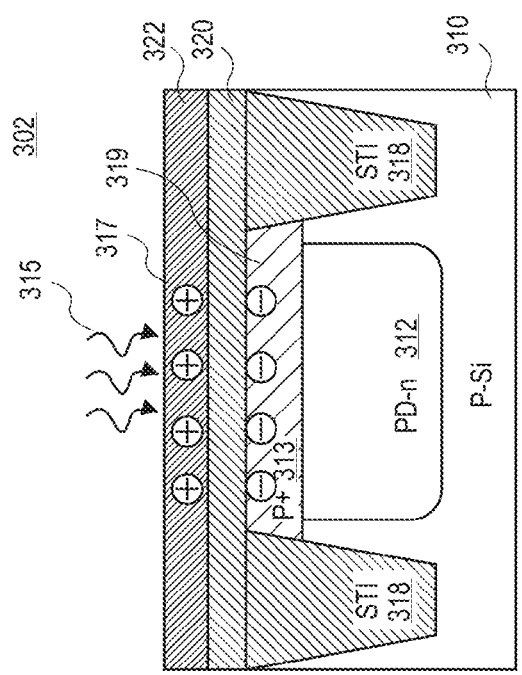
FIG. 3B illustrates a cross-section view of one example of an image sensor pixel disposed in a semiconductor layer without a negatively charged layer in a low light condition after having been illuminated with light.

FIG. 3B shows that after light 315 is no longer present and photodiode region 312 images a darker scene or is in a low light condition after having been illuminated with bright light 315 and after the image has been captured, the induced electrons 319 at the surface of the photodiode region 312 are injected into the photodiode region 312, causing the unwanted memory effect. In other words, when the pixel including photodiode region 312 images a darker scene, the induced electrons 319 at the surface of the photodiode region 312 that were a result of the previously captured image are injected into photodiode region 312, which generates localized dark current causing an unwanted "ghost image" of the previously captured image to appear as a memory effect in pixel array 302.

To address the issues related to memory effect, FIG. 4A shows a cross-section view of an example semiconductor layer 410 included in an example pixel array 402 of a CMOS image sensor in accordance with the teachings of the present invention. It is noted that in one example, pixel array 402 corresponds to a cross-section view along line A-A' of pixel array 202 of FIG. 2. In the illustrated example, pixel array 402 is shown as a front side illuminated pixel array for explanation purposes. In another example, it is appreciated that pixel array 402 could be configured as a back side illuminated pixel array in accordance with the teachings of the present invention. It is noted that pixel array 402 of FIG. 4A shares some similarities with pixel array 302 of FIGS. 3A and 3B. For instance, as shown in the example depicted in FIG. 4A, pixel array 402 includes a semiconductor layer 410, which in one example includes P type silicon, with a plurality of photodiode regions 412 arranged therein. In the example, each one of the plurality of photodiode regions 412 is included in a separate pixel of pixel array 402. In one example, each photodiode region 412 includes an N doped region formed in the P type silicon of semiconductor layer 410. As shown in the depicted example, there are STI 418 regions separating neighboring photodiode regions 412 in the semiconductor layer 410, and therefore define boundaries between the pixels of pixel array 402. A pinning surface layer 413 disposed at the surface of photodiode region 412. In one example, the pinning surface layer 413 includes a P doped pinning region that covers the pixel photosensitive area extending to the STI 418 insulating boundaries and overlaying the N doped photodiode region 412 as shown.

One difference between pixel array 402 of FIG. 4A and pixel array 302 of FIGS. 3A and 3B pixel array 402 of FIG. 4A includes a charged layer 421 that is disposed proximate to pinning surface layer 413 as shown in accordance with the teachings of the present invention. In one example, charged layer 421 is a negatively charged layer and therefore includes fixed negative charge 423 as shown. In various examples, charged layer 421 may be comprised of hafnium oxide (HfOx), aluminum oxide ($Al_2O_3$), zirconium oxide ($ZrO_2$), tantalum oxide ($Ta_2O_5$), and/or titanium oxide ($TiO_2$). In various example, charged layer 421 may be formed by chemical vapor deposition (CVD), sputtering, and/or atomic layer deposition (ALD). It is noted that ALD provides good film quality and reduces interface state.

The example depicted in FIG. 4A shows that contact etch stop layer 422 is disposed over the photodiode region 412 proximate to the charged layer 421 as shown in accordance with the teachings of the present invention. In addition, FIG. 4A shows that a passivation layer 420 is also over photodiode region 412 between the pinning surface layer 413 and the contact etch stop layer 422 as shown. In one example, contact etch stop layer 422 may include a silicon nitride based dielectric including for example, silicon oxynitride, silicon carbide, or the like. In one example, passivation layer 420 may include insulating material such as for example a silicon oxide based dielectric layer or the like. In the particular example illustrated in FIG. 4A, the passivation layer 420 is disposed over the photodiode region 412 between the charged layer 421 and the contact etch stop layer 420 as shown.

In the illustrated example, FIG. 4A shows that a metal interconnect layer 424 is then disposed over contact etch stop layer 422 in accordance with the teachings of the present invention. In one example, metal interconnect layer 424 is a metal stack layer that includes a plurality of metal interconnects 426, which provide electrical connections to the pixel circuitry in the pixel array 402. In one example, metal interconnects 426 include one or more borderless contacts in accordance with the teachings of the present invention. In another example, none of the metal interconnects 426 are borderless contacts in accordance with the teachings of the present invention.

FIG. 4B illustrates a cross-section view of another example of an image sensor pixel with a negatively charged layer included in one example of an image sensor that is illuminated with light in accordance with the teachings of the present invention. It is appreciated that the example cross-section view shown in FIG. 4B shares many similarities with the example cross-section view of the example images sensor pixel shown in FIG. 4A. For instance, in the example cross-section view of the image sensor pixel in FIG. 4B, both the charged layer 421 and the passivation layer 420 are disposed over photo diode region 412 between the pinning surface layer 413 and the contact etch stop layer 422. However, one difference is that in the particular example illustrated in FIG. 4B, the passivation layer 420 is disposed over the photodiode region 412 between the pinning surface layer 413 and the charged layer 421 as shown.

Figure 4D:
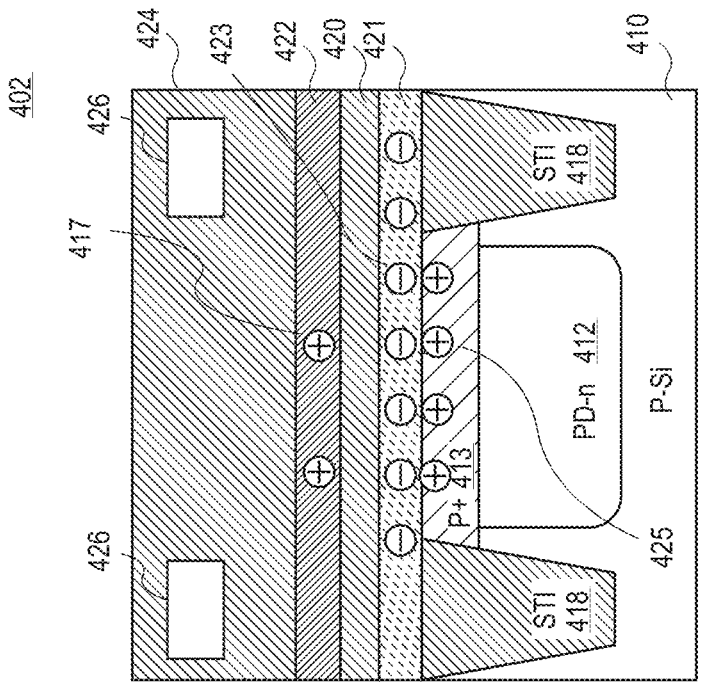
FIG. 4D illustrates a cross-section view of one example of an image sensor pixel with a negatively charged layer included in one example of an image sensor in a low light condition after having been illuminated with light in accordance with the teachings of the present invention.
Figure 4C:
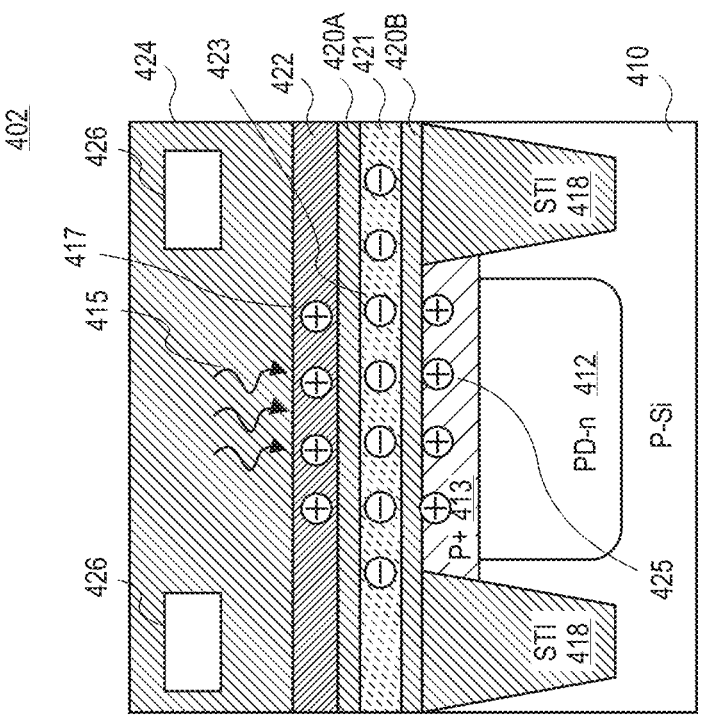
FIG. 4C illustrates a cross-section view of yet another example of an image sensor pixel with a negatively charged layer included in one example of an image sensor that is illuminated with light in accordance with the teachings of the present invention.

FIG. 4C illustrates a cross-section view of yet another example of an image sensor pixel with a negatively charged layer included in one example of an image sensor that is illuminated with light in accordance with the teachings of the present invention. It is appreciated that the example cross-section view shown in FIG. 4C also shares many similarities with the example cross-section view of the example image sensor pixels shown in FIG. 4A as well as the example illustrated in FIG. 4B. For instance, in the example cross-section view of the image sensor pixel in FIG. 4C, the charged layer 421 is disposed over photo diode region 412 between the pinning surface layer 413 and the contact etch stop layer 422. However, one difference is that in the example illustrated in FIG. 4C, the there are at least two passivation layers disposed over photo diode region 412 between the pinning surface layer 413 and the contact etch stop layer 422. For instance, in the particular example illustrated in FIG. 4C, one passivation layer 420B is disposed over the photodiode region 412 between the pinning surface layer 413 and the charged layer 421 as shown. In addition, another passivation 420A is disposed over the photodiode region 412 between the charged layer 421 and the contact etch stop layer 422 as shown.

In all of the examples illustrated FIG. 4A, FIG. 4B and/or FIG. 4C, light 415 illuminates photodiode region 412 through contact etch stop layer 422, which occurs when pixel array 402 captures an image. However, with the presence of charged layer 421 between contact etch stop layer 422 and pinning surface layer 413 as shown in FIG. 4A, FIG. 4B and/or FIG. 4C, the fixed negative charge 423 in charged layer 421 cancels out the positive charge 417 that is induced in contact etch stop layer 422 in response to light 415. In other words, the fixed negative charge 423 in charged layer 421 prevents the induced positive charge 417 in contact etch stop layer 422 from inducing negative charge in the photodiode region 412 in accordance with the teachings of the present invention. Furthermore, the fixed negative charge 423 in charged layer 421 helps to maintain the presence of positive charge 425 or may even to induce additional holes in a hole accumulation layer of the pinning surface layer 413 in accordance with the teachings of the present invention.

Figure 5A:
FIG. 5A shows an example of an original image acquired by an imaging system.
Figure 5B:
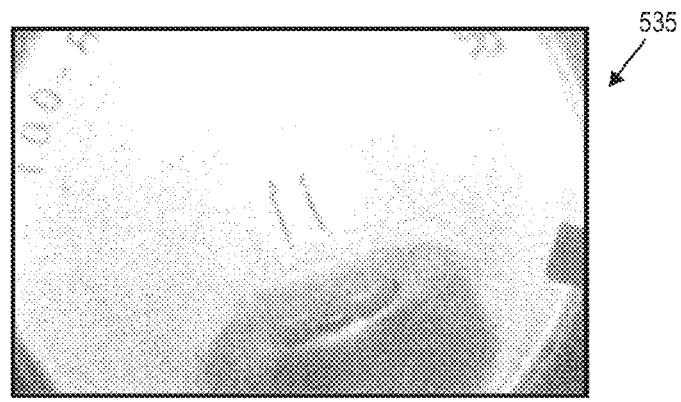
FIG. 5B shows an example of an image acquired by an imaging system without a negatively charged layer showing symptoms of memory effect.
Figure 5C:
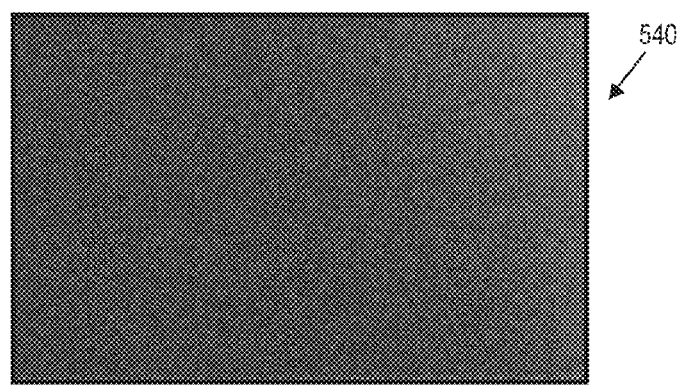
FIG. 5C shows an example of an image acquired by an imaging system including a negatively charged layer in accordance with the teachings of the present invention.

To illustrate, FIG. 4D shows the example cross-section view shown in FIG. 4A after light 415 is no longer present and photodiode region 412 images a darker scene or is in a low light condition after having been illuminated with bright light 415 and after an image has been captured, the positive charge 417 that was previously induced in contact etch stop layer 422 do not induce negative charge in the photodiode region 412 due to the presence of the fixed negative charge 423 in charged layer 421 in accordance with the teachings of the present invention. Furthermore, as shown in the example depicted in FIG. 4B, the positive charge 425 in the hole accumulation layer of the pinning surface layer 413 is maintained in accordance with the teachings of the present invention. Therefore, the memory effect is substantially eliminated with the presence charged layer 421 is formed between the contact etch stop layer 422 and a pinning layer 420 in image sensor 402 in accordance with the teachings of the present invention FIGS. 5A-5C are example images that help illustrate memory effect in a pixel array and the reduction of that memory effect in a pixel array including a charged layer in accordance with the teachings of the present invention. In particular, FIG. 5A shows an example of an original image 530 acquired by an imaging system. FIG. 5B shows an example of an image 535 from an imaging system without a charged layer, and consequently showing the symptoms of memory effect. FIG. 5C shows an example of an image 540 in an imaging system including a charged layer in accordance with the teachings of the present invention. As shown in FIG. 5C, there is no memory effect in image 540 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An image sensor pixel, comprising: a photodiode region having a first polarity doping type disposed in a semiconductor layer; a pinning surface layer having a second polarity doping type disposed over the photodiode region in the semiconductor layer, wherein the second polarity is opposite from the first polarity;
  a first polarity charge layer disposed proximate to the pinning surface layer over the photodiode region;
  a contact etch stop layer disposed over the photodiode region proximate to the first polarity charge layer, wherein the first polarity charge layer is disposed between the pinning surface layer and the contact etch stop layer such that first polarity charge layer cancels out charge having a second polarity that is induced in the contact etch stop layer;
  a metal stack layer that includes a plurality of metal interconnects disposed directly over the contact etch stop layer to provide electrical connections; and
  a passivation layer disposed over the photodiode region between the pinning surface layer and the contact etch stop layer, wherein the passivation layer is disposed over the photodiode region between the pinning surface layer and the first polarity charge layer.

2. The image sensor pixel of claim 1 wherein the contact etch stop layer comprises one of silicon nitride and silicon oxynitride.

3. The image sensor pixel of claim 1 wherein the first polarity charge layer comprises one of hafnium oxide, aluminum oxide, zirconium oxide, tantalum oxide, and titanium oxide.

4. The image sensor pixel of claim 1 wherein the first polarity charge layer disposed between the pinning surface layer and the contact etch stop layer prevents the charge having the second polarity that is induced in the contact etch stop layer from inducing charge having a first polarity in the photodiode region.

5. The image sensor pixel of claim 1 wherein the passivation layer comprises a silicon oxide.

6. The image sensor pixel of claim 1 wherein the first polarity is negative and the second polarity is positive.

7. The image sensor pixel of claim 1 wherein the semiconductor layer comprises silicon.

* * * * *